United States Patent
Prouty et al.

(10) Patent No.: US 12,397,330 B2
(45) Date of Patent: *Aug. 26, 2025

(54) CONDITION SELECTABLE BACKSIDE GAS

(71) Applicant: Applied Materials, Inc., Santa Clara, CA (US)

(72) Inventors: Stephen D. Prouty, San Jose, CA (US); Martin Perez-Guzman, San Jose, CA (US); Sumanth Banda, San Jose, CA (US); Rajinder Dhindsa, Pleasanton, CA (US); Alvaro Garcia de Gorordo, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/138,337

(22) Filed: Apr. 24, 2023

(65) Prior Publication Data

US 2023/0264238 A1   Aug. 24, 2023

Related U.S. Application Data

(63) Continuation of application No. 16/811,282, filed on Mar. 6, 2020, now Pat. No. 11,666,952.

(51) Int. Cl.
  *B08B 9/08* (2006.01)
  *B08B 5/00* (2006.01)
  *H01L 21/30* (2006.01)
  *H01L 21/683* (2006.01)

(52) U.S. Cl.
  CPC .................. *B08B 9/08* (2013.01); *B08B 5/00* (2013.01); *H01L 21/30* (2013.01); *H01L 21/6833* (2013.01); *B08B 2209/08* (2013.01)

(58) Field of Classification Search
  CPC ......... B08B 9/08; B08B 5/00; B08B 2209/08; H01L 21/30; H01L 21/6833
  See application file for complete search history.

(56) References Cited

U.S. PATENT DOCUMENTS

| 6,033,482 A | 3/2000 | Parkhe |
| 11,666,952 B2 | 6/2023 | Prouty et al. |
| 2001/0025783 A1* | 10/2001 | Sundarrajan .......... C23C 14/541 204/192.15 |
| 2002/0171994 A1* | 11/2002 | Grimard ........... H01L 21/67109 361/234 |

(Continued)

*Primary Examiner* — Sharidan Carrillo
(74) *Attorney, Agent, or Firm* — Kilpatrick Townsend & Stockton LLP

(57) ABSTRACT

Methods of semiconductor processing may include performing a process on a semiconductor substrate. The semiconductor substrate may be seated on a substrate support positioned within a processing region of a semiconductor processing chamber. The methods may include flowing a first backside gas through the substrate support at a first flow rate. The methods may include removing the semiconductor substrate from the processing region of the semiconductor processing chamber. The methods may include performing a plasma cleaning operation within the processing region of the semiconductor processing chamber. The methods may include flowing a second backside gas through the substrate support at a second flow rate. At least a portion of the second backside gas may flow into the processing region through accesses in the substrate support.

19 Claims, 5 Drawing Sheets

(56) References Cited

U.S. PATENT DOCUMENTS

| | | | |
|---|---|---|---|
| 2004/0038541 A1 | 2/2004 | Baier | |
| 2004/0144490 A1 | 7/2004 | Zhao et al. | |
| 2006/0051967 A1* | 3/2006 | Chang | H01L 21/31138 |
| | | | 257/E21.252 |
| 2009/0297731 A1 | 12/2009 | Goundar | |
| 2009/0325387 A1 | 12/2009 | Chen et al. | |
| 2013/0276821 A1* | 10/2013 | Sexton | H01J 37/3244 |
| | | | 134/1.2 |
| 2014/0158154 A1 | 6/2014 | Kondo et al. | |
| 2015/0376780 A1 | 12/2015 | Khaja et al. | |
| 2016/0141175 A1 | 5/2016 | Yan et al. | |
| 2018/0023193 A1 | 1/2018 | Baluja et al. | |
| 2018/0197721 A1* | 7/2018 | Swaminathan | H01J 37/32522 |
| 2019/0066998 A1 | 2/2019 | Hawrylchak et al. | |
| 2019/0157051 A1 | 5/2019 | Belau et al. | |
| 2021/0276056 A1 | 9/2021 | Prouty et al. | |

* cited by examiner

CONDITION SELECTABLE BACKSIDE GAS

CROSS-REFERENCE TO RELATED APPLICATIONS

This application is a continuation of U.S. application Ser. No. 16/811,282, filed Mar. 6, 2020, now U.S. Pat. No. 11,666,952, which is hereby incorporated by reference in its entirety for all purposes.

TECHNICAL FIELD

The present technology relates to semiconductor systems, processes, and equipment. More specifically, the present technology relates to processes and systems to protect substrate support assemblies.

BACKGROUND

Many substrate processing systems use substrate holders, such as an electrostatic chuck in combination with a base, to retain a wafer during semiconductor substrate processing. A backside purge gas may be delivered between the substrate seated on the chuck and the chuck surface to regulate the temperature of the wafer. This gas may be delivered during substrate processing, and may exit the substrate support through apertures or flow paths through the chuck. Typically, after a certain amount of processing, a chamber cleaning operation may be performed, during which plasma byproducts are utilized to strip residual materials from chamber surfaces, including the chuck. However, the cleaning materials may also damage aspects of the chuck during the cleaning.

Thus, there is a need for improved systems and methods that can be used to improve lifetime and performance of processing chambers and components. These and other needs are addressed by the present technology.

SUMMARY

Methods of semiconductor processing may include performing a process on a semiconductor substrate. The semiconductor substrate may be seated on a substrate support positioned within a processing region of a semiconductor processing chamber. The methods may include flowing a first backside gas through the substrate support at a first flow rate. The methods may include removing the semiconductor substrate from the processing region of the semiconductor processing chamber. The methods may include performing a plasma cleaning operation within the processing region of the semiconductor processing chamber. The methods may include flowing a second backside gas through the substrate support at a second flow rate. At least a portion of the second backside gas may flow into the processing region through accesses in the substrate support.

In some embodiments, the plasma cleaning operation may include an oxygen-containing precursor or a halogen-containing precursor. The second flow rate may limit ingress of plasma byproducts into the accesses in the substrate support. The first backside gas and the second backside gas may be non-reactive species. The first backside gas may be or include helium, and the second backside gas may be or include nitrogen or a noble gas. The first backside gas may be or include helium and at least one of argon or nitrogen. The first flow rate may be less than or about 10 sccm, and the second flow rate may be greater than the first flow rate. The second flow rate may be configured to provide contact of effluents during the plasma cleaning operation with the substrate support about the accesses of the substrate support.

Some embodiments of the present technology may encompass methods of semiconductor processing. The methods may include flowing a first backside gas at a first flow rate through a substrate support in a processing region of a semiconductor processing chamber while processing a semiconductor substrate seated on the substrate support. The methods may include removing the semiconductor substrate from the semiconductor processing chamber. The methods may include performing a plasma cleaning operation within the processing region of the semiconductor processing chamber. The methods may include flowing a second backside gas through the substrate support at a second flow rate while performing the plasma cleaning operation. At least a portion of the second backside gas may flow into the processing region through accesses in the substrate support.

In some embodiments, the plasma cleaning operation may include an oxygen-containing precursor or a halogen-containing precursor. The first backside gas and the second backside gas may be non-reactive species. The first backside gas may include helium, and the second backside gas may include non-reactive species including at least one of nitrogen or a noble gas. The first backside gas may be or include helium and at least one of argon or nitrogen. The first flow rate may be less than or about 10 sccm, and the second flow rate may be greater than the first flow rate.

Some embodiments of the present technology may encompass methods of semiconductor processing. The methods may include performing a process on a semiconductor substrate. The semiconductor substrate may be seated on a substrate support within a processing region of a semiconductor processing chamber. The process may be performed while maintaining the substrate support at a temperature below or about 0° C. The methods may include raising the semiconductor substrate from the substrate support. The methods may include forming a plasma of a post-treatment precursor within the processing region of the semiconductor processing chamber. The methods may include flowing a non-reactive backside gas through the substrate support and between the semiconductor substrate and the substrate support. The methods may include increasing a temperature of the semiconductor substrate.

In some embodiments, raising the semiconductor substrate may include separating the semiconductor substrate from the substrate support and supporting the semiconductor substrate on lift pins extending through the substrate support. The process may be performed while maintaining the substrate support at a temperature below or about -100° C. The non-reactive backside gas may be or include nitrogen or a noble gas. The non-reactive backside gas may be flowed at a flow rate to limit ingress of particles between the semiconductor substrate and the substrate support. The non-reactive backside gas may be flowed at a flow rate of up to or about 50 sccm.

Such technology may provide numerous benefits over conventional systems and techniques. For example, the processes may limit plasma species from flowing within accesses of the substrate support. Additionally, the processes may improve backside gas effectiveness and reduce processing costs over conventional technologies. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
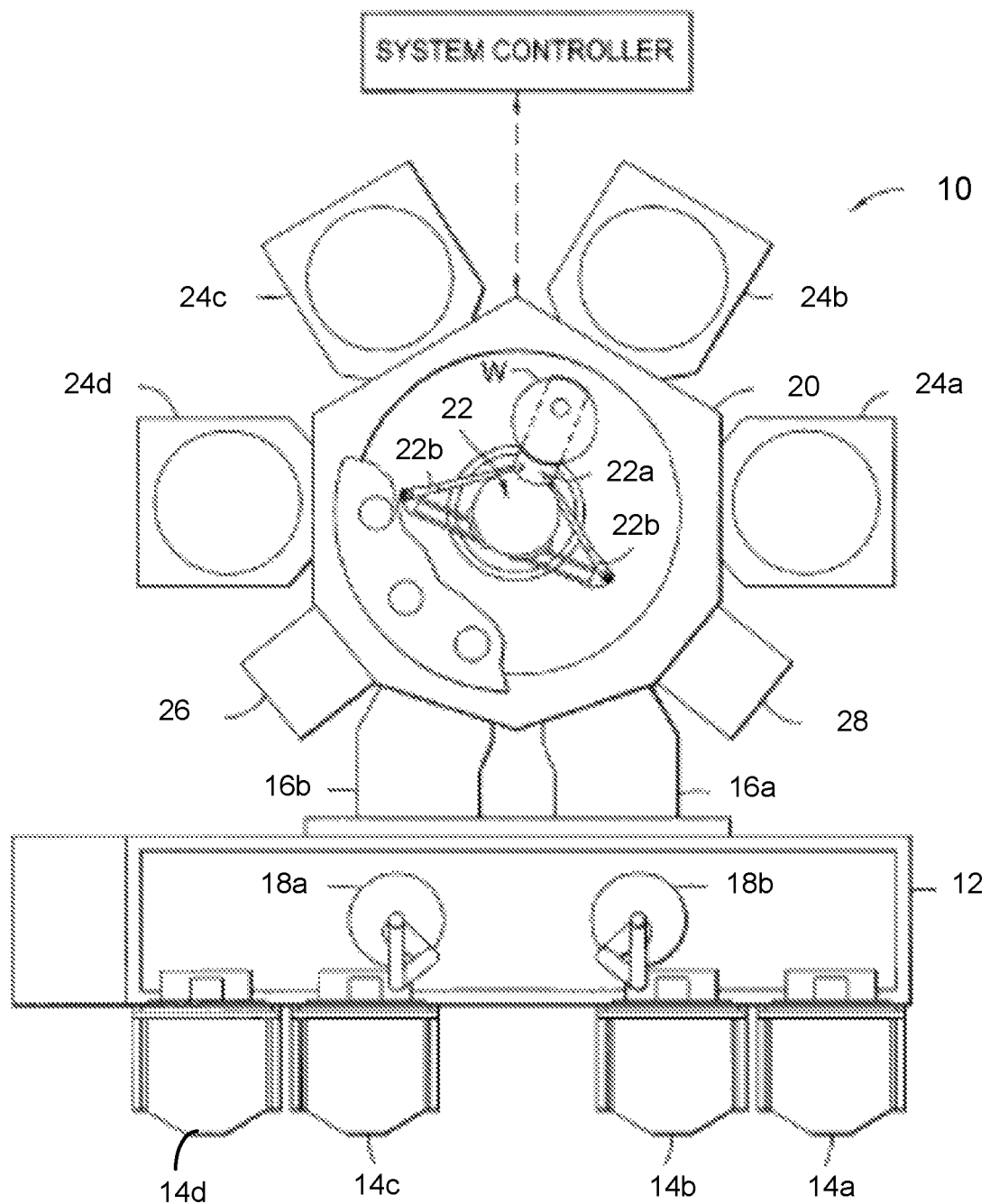
FIG. 1 shows a schematic top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Semiconductor processing includes a number of formation and removal operations performed to produce intricate structures on a substrate. Both deposition processes and etch processes have ancillary effects within a processing chamber. For example, deposition processes, while forming material on a substrate, may also form material on chamber components such as walls and showerheads. Etching processes may be performed to physically or chemically remove aspects on a substrate, which may produce byproducts. Although much of the byproduct material may be exhausted from the processing chamber, material may also fall back onto the substrate or the substrate support, or may adhere to other chamber components. Consequently, in many semiconductor processing chambers, cleaning operations may be performed after processing.

Many cleaning operations may utilize plasma enhanced precursors, which may remove residual materials from the chamber processing region surfaces. However, conventional processes may damage exposed surfaces of the processing region. Additionally, plasma byproducts may penetrate accesses of an exposed substrate support surface. Backside gas delivery may be performed during substrate processing to control thermal uniformity through the substrate support. A backside gas may be delivered within the substrate support, which may purge through one or more access locations across the substrate. The backside gas may not be delivered during cleaning operations, and plasma byproducts may flow within access points within the substrate support. This may cause damage or erosion to components of the chuck, which causes increased replacement costs in conventional systems.

The present technology overcomes these issues by utilizing backside gases during cleaning operations. The present technology may plumb one or more gases into the backside of the chuck and to fluidly access the backside of the wafer, which may provide increased tuning for thermal control as well as part maintenance during cleaning operations. By modifying the gases delivered and flow rates, improved performance may be provided. Additionally, the systems may afford additional operational adjustments to improve substrate processing and queue times.

Although the remaining disclosure will routinely identify specific etching and cleaning processes utilizing the disclosed technology, it will be readily understood that the systems and methods are equally applicable to a variety of other processes as may occur in the described chambers. Accordingly, the technology should not be considered to be so limited as for use with the described treatment and cleaning processes alone. The disclosure will discuss one possible system and chamber that can be used with the present technology before describing systems and methods or operations of exemplary process sequences according to some embodiments of the present technology. It is to be understood that the technology is not limited to the equipment described, and processes discussed may be performed in any number of processing chambers and systems.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24a-d, a transfer chamber 20, a service chamber 26, an integrated metrology chamber 28, and a pair of load lock chambers 16a-b. The process chambers may include any number of structures or components, as well as any number or combination of processing chambers.

To transport substrates among the chambers, the transfer chamber 20 may contain a robotic transport mechanism 22. The transport mechanism 22 may have a pair of substrate transport blades 22a attached to the distal ends of extendible arms 22b, respectively. The blades 22a may be used for carrying individual substrates to and from the process chambers. In operation, one of the substrate transport blades such as blade 22a of the transport mechanism 22 may retrieve a substrate W from one of the load lock chambers such as chambers 16a-b and carry substrate W to a first stage of processing, for example, a treatment process as described below in chambers 24a-d. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22a and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16a-b. From the load lock chambers 16a-b, the substrate may move into a factory interface 12. The factory interface 12 generally may operate to transfer substrates between pod loaders 14a-d in an atmospheric pressure clean environment and the load lock chambers 16a-b. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18a-b, may be positioned in factory interface 12 to transport substrates between various positions/locations within factory interface 12 and to other locations in communication therewith. Robots 18a-b may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24a-d may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2:
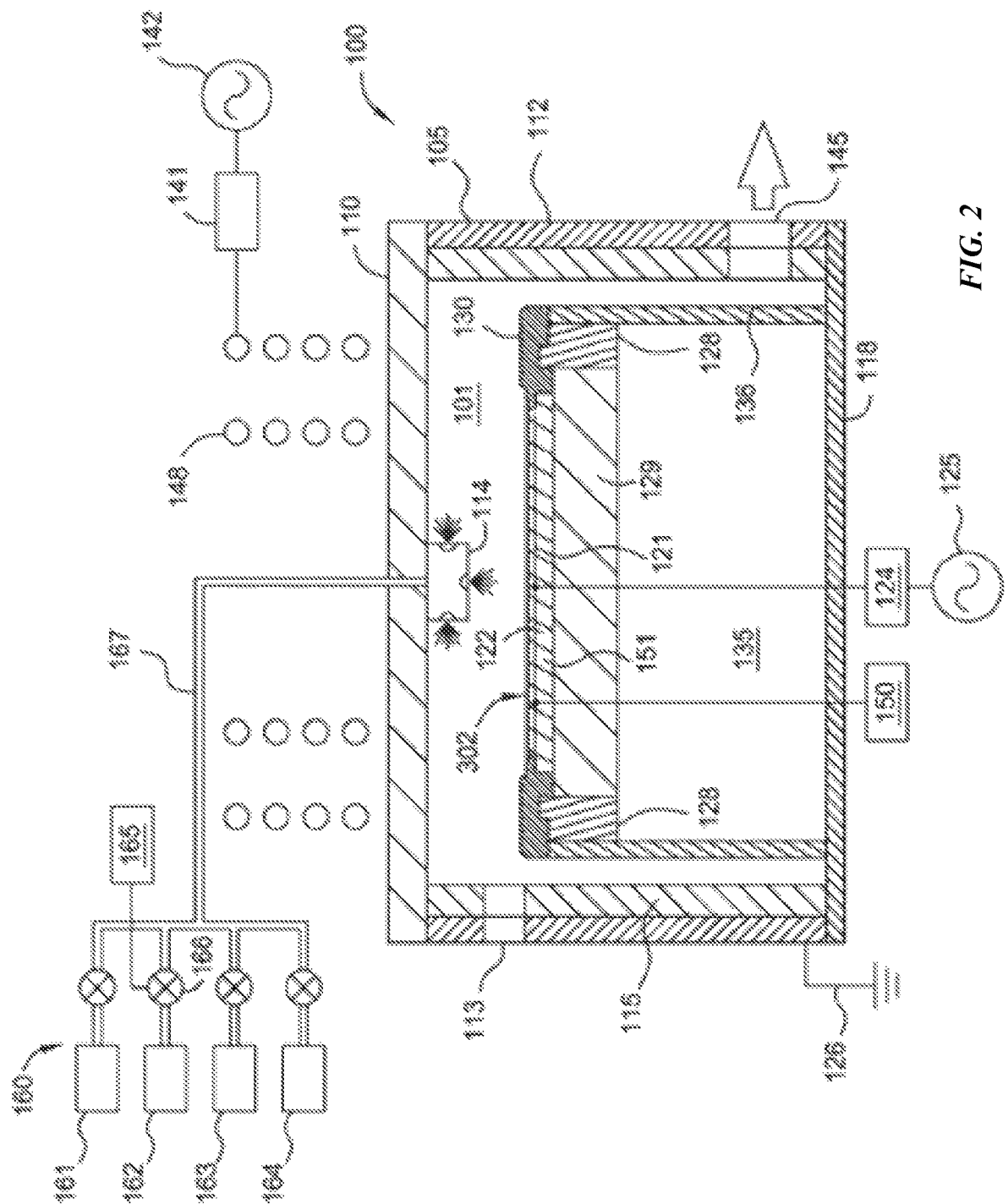
FIG. 2 shows a schematic cross-sectional view of an exemplary processing system according to some embodiments of the present technology.

FIG. 2 illustrates a schematic cross-sectional view of an exemplary processing chamber 100 suitable for patterning a material layer disposed on a substrate 302 in the processing chamber 100. The exemplary processing chamber 100 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 100 may include a chamber body 105 defining a chamber volume 101 in which a substrate may be processed. The chamber body 105 may have sidewalls 112 and a bottom 118 which are coupled with ground 126. The sidewalls 112 may have a liner 115 to protect the sidewalls 112 and extend the time between maintenance cycles of the plasma processing chamber 100. The dimensions of the chamber body 105 and related components of the plasma processing chamber 100 are not limited and generally may be proportionally larger than the size of the substrate 302 to be processed therein. Examples of substrate sizes include 200 mm diameter, 250 mm diameter, 300 mm diameter and 450 mm diameter, among others, such as display or solar cell substrates as well.

The chamber body 105 may support a chamber lid assembly 110 to enclose the chamber volume 101. The chamber body 105 may be fabricated from aluminum or other suitable materials. A substrate access port 113 may be formed through the sidewall 112 of the chamber body 105, facilitating the transfer of the substrate 302 into and out of the plasma processing chamber 100. The access port 113 may be coupled with a transfer chamber and/or other chambers of a substrate processing system as previously described. A pumping port 145 may be formed through the sidewall 112 of the chamber body 105 and connected to the chamber volume 101. A pumping device may be coupled through the pumping port 145 to the chamber volume 101 to evacuate and control the pressure within the processing volume. The pumping device may include one or more pumps and throttle valves.

A gas panel 160 may be coupled by a gas line 167 with the chamber body 105 to supply process gases into the chamber volume 101. The gas panel 160 may include one or more process gas sources 161, 162, 163, 164 and may additionally include inert gases, non-reactive gases, and reactive gases, as may be utilized for any number of processes. Examples of process gases that may be provided by the gas panel 160 include, but are not limited to, hydrocarbon containing gas including methane, sulfur hexafluoride, silicon chloride, carbon tetrafluoride, hydrogen bromide, hydrocarbon containing gas, argon gas, chlorine, nitrogen, helium, or oxygen gas, as well as any number of additional materials. Additionally, process gasses may include nitrogen, chlorine, fluorine, oxygen, and hydrogen containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, $CO$, $N_2$, $NO_2$, $N_2O$, and $H_2$, among any number of additional precursors.

Valves 166 may control the flow of the process gases from the sources 161, 162, 163, 164 from the gas panel 160 and may be managed by a controller 165. The flow of the gases supplied to the chamber body 105 from the gas panel 160 may include combinations of the gases form one or more sources. The lid assembly 110 may include a nozzle 114. The nozzle 114 may be one or more ports for introducing the process gases from the sources 161, 162, 164, 163 of the gas panel 160 into the chamber volume 101. After the process gases are introduced into the plasma processing chamber 100, the gases may be energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 302 and/or above the substrate 302 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 may be disposed in the chamber volume 101 to support the substrate 302 during processing. The substrate support pedestal 135 may include an electrostatic chuck 122 for holding the substrate 302 during processing. The electrostatic chuck ("ESC") 122 may use the electrostatic attraction to hold the substrate 302 to the substrate support pedestal 135. The ESC 122 may be powered by an RF power supply 125 integrated with a match circuit 124. The ESC 122 may include an electrode 121 embedded within a dielectric body. The electrode 121 may be coupled with the RF power supply 125 and may provide a bias which attracts plasma ions, formed by the process gases in the chamber volume 101, to the ESC 122 and substrate 302 seated on the pedestal. The RF power supply 125 may cycle on and off, or pulse, during processing of the substrate 302. The ESC 122 may have an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Electrode 121 may be coupled with a power source 150. The power source 150 may provide a chucking voltage of about 200 volts to about 2000 volts to the electrode 121. The power source 150 may also include a system controller for controlling the operation of the electrode 121 by directing a DC current to the electrode 121 for chucking and de-chucking the substrate 302. The ESC 122 may include heaters disposed within the pedestal and connected to a power source for heating the substrate, while a cooling base 129 supporting the ESC 122 may include conduits for circulating a heat transfer fluid to maintain a temperature of the ESC 122 and substrate 302 disposed thereon. The ESC 122 may be configured to perform in the temperature range required by the thermal budget of the device being fabricated on the substrate 302. For example, the ESC 122 may be configured to maintain the substrate 302 at a temperature of about −150° C. or lower to about 500° C. or higher depending on the process being performed.

The cooling base 129 may be provided to assist in controlling the temperature of the substrate 302. To mitigate process drift and time, the temperature of the substrate 302 may be maintained substantially constant by the cooling base 129 throughout the time the substrate 302 is in the cleaning chamber. In some embodiments, the temperature of the substrate 302 may be maintained throughout subsequent cleaning processes at temperatures between about −150° C. and about 500° C., although any temperatures may be utilized. A cover ring 130 may be disposed on the ESC 122 and along the periphery of the substrate support pedestal 135. The cover ring 130 may be configured to confine etching gases to a desired portion of the exposed top surface of the substrate 302, while shielding the top surface of the substrate support pedestal 135 from the plasma environment inside the plasma processing chamber 100. Lift pins may be selectively translated through the substrate support pedestal 135 to lift the substrate 302 above the substrate support pedestal 135 to facilitate access to the substrate 302 by a transfer robot or other suitable transfer mechanism as previously described.

The controller 165 may be utilized to control the process sequence, regulating the gas flows from the gas panel 160 into the plasma processing chamber 100, and other process parameters. Software routines, when executed by the CPU, transform the CPU into a specific purpose computer such as a controller, which may control the plasma processing chamber 100 such that the processes are performed in accordance with the present disclosure. The software routines may also be stored and/or executed by a second controller that may be associated with the plasma processing chamber 100.

Figure 3:
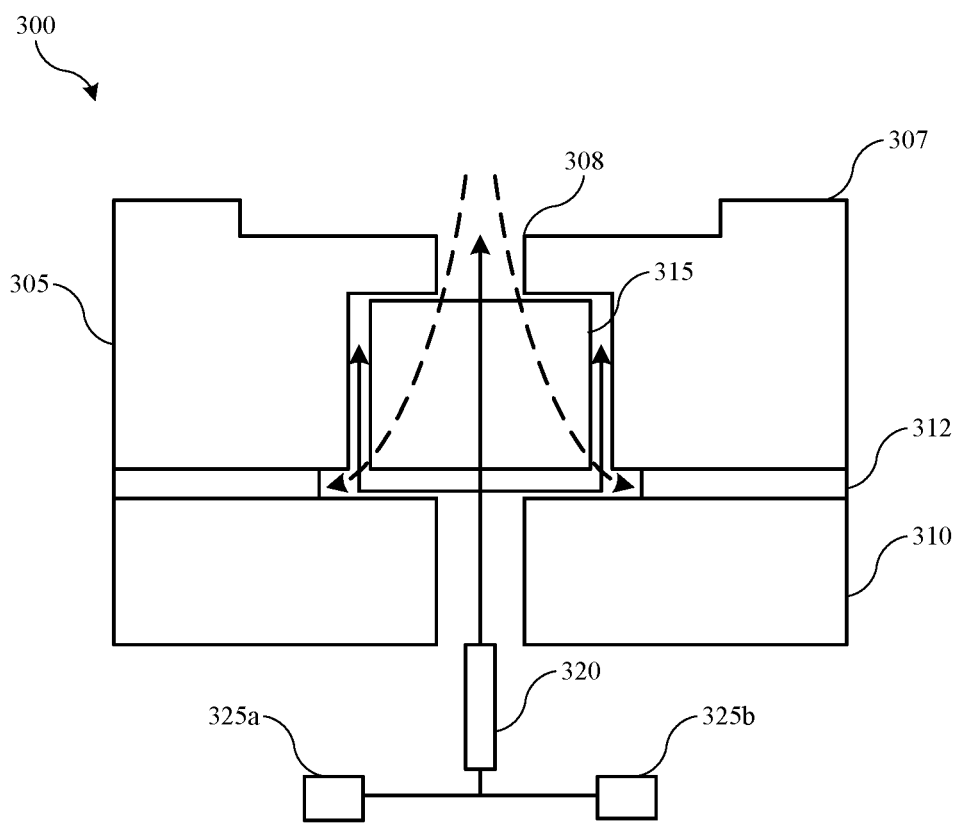
FIG. 3 shows a schematic partial cross-sectional view of an exemplary substrate support according to some embodiments of the present technology.

FIG. 3 shows a schematic partial cross-sectional view of an exemplary substrate support 300 according to some embodiments of the present technology. For example, substrate support 300 may illustrate a portion of support pedestal 135 described above, and may include any aspect of that support assembly, including electrodes, heaters, or any other components as may be incorporated in substrate supports. Substrate support 300 may also illustrate additional details of support assemblies described above. Substrate support 300 may illustrate a small cross-section of a support structure, which may be recurring across the substrate support. It is to be understood that substrate support 300 is not illustrated to any particular scale, and is included merely to illustrate aspects of the present technology.

Substrate support 300 may include a number of components bonded, welded, joined, or otherwise coupled with one another. Although a number of additional components may be included, as illustrated, the substrate support 300 may include a puck 305, which may be coupled with a power source to provide electrostatic chucking or clamping of a substrate on a surface of the puck. Although any surface topography may be encompassed by the present technology, in some embodiments puck 305 may define a number of protrusions or mesas 307 on which a substrate may be seated. Between the protruding portions of the puck, may be recessed regions as illustrated, within which may be defined one or more apertures 308, which will be described further below. The substrate support 300 may also include a cooling base 310 with which the puck 305 is bonded, such as with bonding material 312. The bonding material may facilitate heat transfer and coupling between the two components. Cooling base 310 may include any number of temperature controlled devices or materials, such as temperature controlled fluids, which may facilitate cooling of the substrate support 300, as well as a substrate disposed thereon. For example, cooling base 310 may define channels, which may create a flow path for a cooling fluid through the base. A chiller or other system may be coupled in a heat exchange loop to maintain temperature control, and delivery of cooled fluid to the base.

Bonding material 312 may be any number of materials that may provide sufficient coupling and sealing between the components of the substrate support 300. For example, the bonding material 312 may be a polymeric material, sealant, rubber, metal, or other material. In one non-limiting example, a polymerized silicon-containing material may be utilized, such as a polysiloxane, which may include any number of organic or inorganic functional groups within the structure. The bonding material 312 may not fully seal all aspects of the puck, which may allow a number of components to extend through the substrate support to the puck. For example, heater filaments, thermocouples or other measurement devices, as well as chucking electrodes may be accessed within the puck 305, and may extend through the substrate support, such as through a stem of the pedestal structure, which may extend through the processing chamber as previously described.

In some embodiments, substrate support 300 may also include one or more plugs 315, which may be disposed adjacent apertures 308. Any number of aperture and plug patterns may be formed across the puck. Plugs 315 may be a porous material, which may allow gases to flow through the plugs. The plugs may also be positioned to be flush with one or more surfaces of the puck, although the illustration shows gaps extending about the plugs. Although one or more gaps may occur, in some embodiments the plugs may be press fit or otherwise made flush with surfaces of the puck, and gas flow may occur partially and/or substantially through the porous material. Any number of materials may be used, including porous aluminum-containing materials, such as oxides or nitrides, for example. In some embodiments the plugs 315 may be a more porous but similar material as the material of puck 305.

During semiconductor processing, one or more backside gases may be flowed into the substrate support 300, such as through one or more channels extending through the stem of the substrate support. For example, a gas delivery system 320, which may include any number of valves, controllers, and/or piping, may provide one or more gases, which may be flowed in and around gaps within the substrate support. Open gaps within the support may not adequately distribute cooling from the base 310, which may produce hot spots at the substrate, and which may affect uniformity of operations being performed, be they formation or removal operations. Accordingly, by providing a positive pressure of fluid, such as an inert or non-reactive gas, within the substrate support, improved heat transfer within the substrate support may be maintained.

Any number of materials may be used as a heat transfer backside gas, and in some embodiments helium, nitrogen, argon, other noble gases, or other process gases may be utilized. Helium may be characterized by improved heat transfer relative to other precursors due to the relatively low molecular weight of the fluid. For example, thermal conductivity may increase as molecular weight decreases, and thus helium may facilitate improved temperature uniformity through the structure when flowed within gaps of the apparatus. In some embodiments, the helium may be augmented with one or more other precursors, which may adjust the thermal conductance of the backside gas. For example, helium may be provided to gas delivery system 320 from source 325a, and one or more other gases may be provided from source 325b, or other individual sources. By providing nitrogen, argon, or other materials, the heat transfer characteristics of the fluid may be modulated for particular processes. Helium, as a non-renewable resource, may be a more expensive material relative to materials such as nitrogen or argon, and thus limiting the amount of helium used during a process may reduce production costs.

During substrate processing, a flow rate and/or pressure of the backside gas delivered may be maintained relatively low, and may be delivered at a flow rate to maintain an amount of pressure to improve thermal conductivity and maintain a minimal amount of leak through the substrate support into the processing region. Consequently, in some embodiments the flow rate may be maintained below or about 20 sccm, and may be maintained at below or about 15 sccm, below or about 12 sccm, below or about 10 sccm, below or about 9 sccm, below or about 8 sccm, below or about 7 sccm, below or about 6 sccm, below or about 5 sccm, below or about 4 sccm, below or about 3 sccm, below or about 2 sccm, below or about 1 sccm, or less, although an amount of flow may be maintained such that a controller of gas delivery system 320 may be operated above a threshold.

Subsequent processing, the substrate may be removed from the processing chamber, and a cleaning operation may be performed as described above. Any number of cleaning operations may be encompassed by the present technology, and examples are not intended to limit the scope of the present technology. In one non-limiting example, a plasma cleaning operation may be performed. Plasma byproducts may be generated remotely, or may be generated within the processing region, such as at the substrate level. The plasma byproducts may be used to reduce or remove materials from the processing region surfaces, including the substrate support, and may include any number of precursors including oxygen-containing precursors, halogen-containing precursors, or any other material.

Because cleaning operations may be performed subsequent removal of the substrate, the support surface of the puck 305 may be exposed during the cleaning, and apertures 308 may be accessible to plasma byproducts during the cleaning. Plasma byproducts may contact plug 315, and may attack the porous material. Additionally, as illustrated in the figure with the dashed arrows, plasma byproducts may flow through plug 315, or through gaps between the plug and the puck 305, and may access bonding material 312. Many plasma effluent materials may erode a polymeric bonding material, which may impact performance. For example, as bonding material 312 is eroded from between the cooling base and the puck, heat transfer between the components may be reduced, or may be inconsistent along gap regions.

To limit ingression of plasma effluent materials, some embodiments of the present technology may provide a backside gas from gas delivery system 320 during chamber cleaning operations. An increased flow of backside gas may be provided to block ingress of plasma byproducts, as illustrated by solid arrows in the figure. However, helium may not sufficiently limit ingress during some cleaning operations, and embodiments of the present technology may reduce helium flow during chamber cleaning, or may fully halt helium delivery and utilize alternative precursors, such as argon or nitrogen, among any precursor that may not be reactive with plasma byproducts or components of the system.

Helium may be characterized by a smaller molecule characterized by a smaller mass, and thus even at increased flow rates, the gas may not produce sufficient collisions to adequately limit ingress of plasma byproducts produced during cleaning operations due to reduced momentum transfer during collisions. Consequently, in some embodiments, the present technology may utilize one or more gases characterized by larger molecules during chamber cleaning operations to ensure plasma effluent species are blocked sufficiently from entering aspects of the puck. In some embodiments, helium may be flowed with one or more gases previously noted in any ratio from 0% to 100% of either or any combination of gases. In some embodiments, helium may not be flowed as a backside gas during the cleaning operation, which may also improve on operational costs due to the reduction in helium use. In some embodiments, argon, nitrogen, any other noble gas, or any other precursor or combination of precursors may be flowed as backside gas during cleaning operations to reduce or limit ingress of plasma byproducts into the substrate support. The precursors may be non-reactive species with materials to be removed and/or components of the substrate support, and may be inert to any of these materials in some embodiments.

A flow rate of the backside gas may also be increased during the cleaning operation relative to the flow rate during substrate processing. For example, in some embodiments the flow rate for the backside gas during cleaning operations may be greater than or about 15 sccm, and may be greater than or about 20 sccm, greater than or about 25 sccm, greater than or about 30 sccm, greater than or about 35 sccm, greater than or about 40 sccm, greater than or about 45 sccm, greater than or about 50 sccm, or more. The flow may also be controlled to ensure plasma byproducts are able to access surfaces about apertures or accesses of the puck. For example, with sufficiently high flow rates, the backside gas may limit access within a region about the accesses from which the backside gas flows, and thus, in some embodiments the backside gas may be flowed at a rate of less than or about 100 sccm, and may be flowed at a rate of less than or about 90 sccm, less than or about 80 sccm, less than or about 70 sccm, less than or about 60 sccm, less than or about 50 sccm, less than or about 40 sccm, or less.

Figure 4:
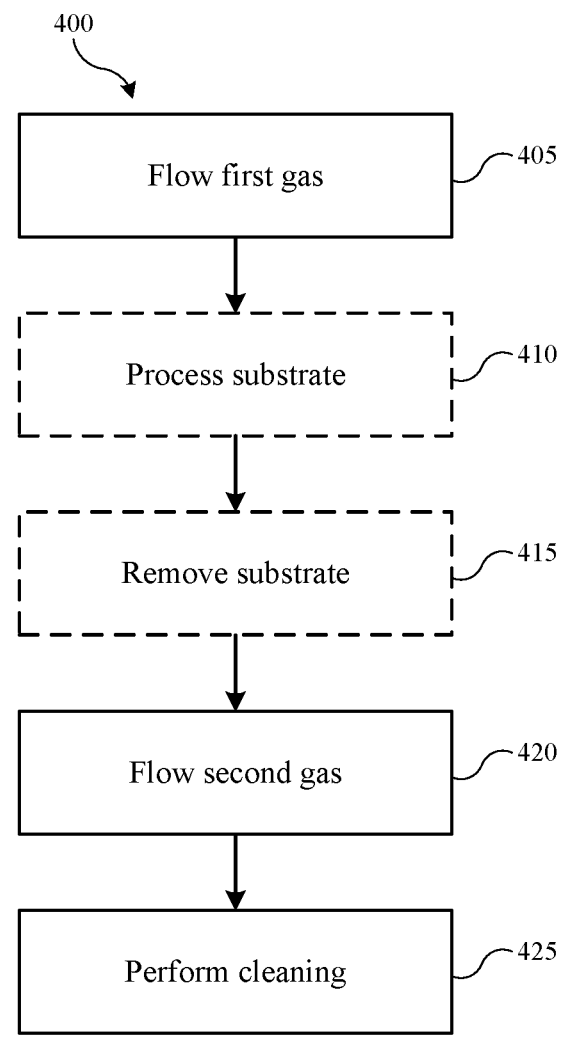
FIG. 4 shows selected operations in a method of processing a semiconductor substrate according to some embodiments of the present technology.

FIG. 4 illustrates a method 400 of processing a semiconductor substrate, operations of which may be performed, for example, in one or more chambers 100 incorporated on multi-chamber processing system 10 as previously described. Any other chamber may also be utilized, which may perform one or more operations of any method or process described. Additionally, the method may be performed with chambers or systems including substrate supports that may be or include any aspect of substrate support 300 described previously. Method 400 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

During processing operations, or during some operation for which a substrate is included within the processing chamber, a first backside gas may be flowed through the substrate support at operation 405. The first backside gas may be flowed at a first flow rate, which may be or include any flow rate or range noted or encompassed previously. Any aspect of the delivery may be or include any consideration previously discussed. In some embodiments, the first backside gas may be flowed to provide heat transfer, and facilitate thermal uniformity within the substrate support, and may include helium or any other noted precursor. Additionally, any combination or adjustment to flow rate and gases, including during processing, may be performed.

Method 400 may involve optional operations to develop a semiconductor substrate to a particular fabrication operation. Although in some embodiments method 400 may be performed on a base structure, in some embodiments the method may be performed subsequent other material formation. For example, any number of deposition, masking, or removal operations may be performed at optional operation 410 to produce any transistor, memory, or other structural aspects on a substrate. The substrate may be disposed on a substrate support, which may be positioned within a processing region of a semiconductor processing chamber. The operations may be performed in the same chamber in which aspects of method 400 may be performed, and one or more operations may also be performed in one or more chambers on a similar platform as a chamber in which operations of method 400 may be performed, or on other platforms.

In some embodiments, the method may include removing the semiconductor substrate from the processing region of the chamber at optional operation 415. In some embodiments the methods may include flowing a second backside gas through the substrate support at operation 420. The second backside gas may be flowed at a second flow rate. The second flow rate may similarly be any flow rate discussed previously and the flow may be controlled so at least a portion of the second backside gas may flow through the puck and accesses of the puck into the processing region. In some embodiments the second flow rate may be higher than the first flow rate, and may be at least partially intended to reduce or limit ingression of plasma byproducts, by providing sufficient flow or molecules to contact and extinguish or block effluents from accessing apertures of the substrate support.

The plasma byproducts may be produced during a cleaning process, which may be performed in the processing region of the chamber at operation 425. The cleaning process may be any cleaning operation to remove residue or other material from within the processing region. In some embodiments the operation may be or include a plasma enhanced cleaning operation, which may include remotely or locally producing plasma byproducts of one or more precursors to facilitate material removal. Any precursor as previously described may be utilized or included. During the cleaning operation, a substrate may or may not be present within the processing region, and the substrate support may or may not be fully exposed to the cleaning materials, such as plasma byproducts for example.

The first backside gas and the second backside gas may be or include similar gases, or may be different gases in embodiments. For example, in some embodiments any of the backside gases may include any previously noted gas, or combination of gases. The backside gases may be non-reactive species, which may mean that the backside gases may not chemically react with materials being cleaned from the processing chamber, and may not chemically corrode materials of the substrate support. In some embodiments the first backside gas may include helium and/or any other gas noted. The second backside gas may include helium and/or any other gas noted, although in some embodiments the second backside gas may include less helium or a lower ratio of helium, including no helium in some embodiments. By utilizing additional precursors, such as argon or nitrogen, for example, the second backside gas may include a higher collision potential than smaller molecule precursors, such as helium, which may improve such as to limit or prevent the ingress of plasma byproducts, which may improve the performance and integrity of the substrate supports.

Utilizing backside gases in embodiments of the present technology may protect components or surfaces during substrate processing as well. For example, during substrate processing, additional operations may be performed by adjusting or changing the flow rate of the precursor used for the backside gas. This may facilitate operations in a number of semiconductor processes by providing additional flexibility. As one non-limiting example, modulating backside gases may facilitate low-temperature processes. For example, in low temperature processing, such as operations that may occur below 0° C., for example, processing may include raising a temperature of a substrate prior to removal from a processing chamber. When the substrate support may be facilitating the low temperature operation, heating the substrate may be challenged by the contact with a colder support.

One solution encompassed by the present technology may include raising the substrate from the surface of the substrate support to at least partially thermally decouple the substrate and the support, such as to reduce conductive coupling. In some embodiments the substrate may be raised to a height of greater than or about 10 µm above a surface of the substrate support, and may be raised to a height of greater than or about 100 µm, greater than or about 500 µm, greater than or about 1 mm, greater than or about 2 mm, greater than or about 5 mm, greater than or about 10 mm, or more. In some embodiments an additional chamber component may be used to raise the substrate from a processing temperature. In some embodiments a plasma may be formed within the processing region, which may raise the substrate temperature. The additional operations may similarly increase a temperature or otherwise cause byproducts of processing to be pulled from the substrate or surfaces of the processing chamber. In some embodiments the substrate support may still be characterized by a lower temperature, which may cause the materials to condense or otherwise deposit on the substrate support. This may cause additional cleaning operations to be performed after the substrate has been removed, and in some cases a cleaning operation may not remove the materials from the substrate. This may cause a number of challenges including plugging of accesses or leak issues through the puck. The present technology may utilize backside gases to improve these processes as well, and may also reduce condensation of reactive chemicals within the porous plug region.

Figure 5:
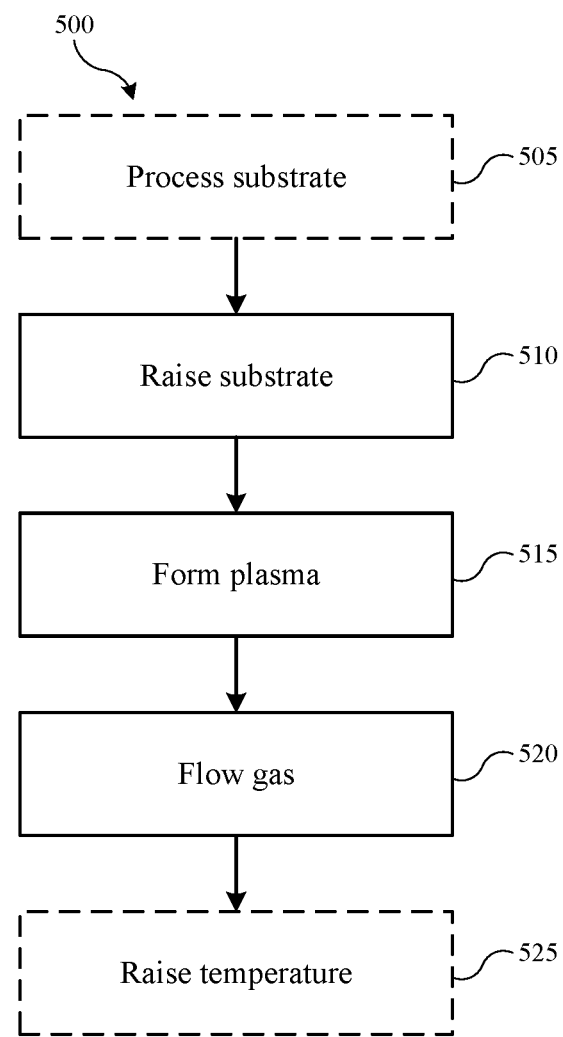
FIG. 5 shows selected operations in a method of processing a semiconductor substrate according to some embodiments of the present technology.

FIG. 5 shows selected operations in a method 500 of processing a semiconductor substrate according to some embodiments of the present technology. In embodiments, operations of the method may be performed, for example, in one or more chambers 100 incorporated on multi-chamber processing system 10 as previously described. Any other chamber may also be utilized, which may perform one or more operations of any method or process described. Additionally, the method may be performed with chambers or systems including substrate supports that may be or include any aspect of substrate support 300 described previously. Method 500 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

Method 500 may involve optional operations to develop the semiconductor structure to a particular fabrication operation, and may include any aspect of method 400 as described above. Although in some embodiments method 500 may be performed on a base structure, in some embodiments the method may be performed subsequent other material formation or removal. For example, any number of deposition, masking, or removal operations may be performed at optional operation 505 to produce any transistor, memory, or other structural aspects on a substrate. The substrate may be disposed on a substrate support, which may be positioned within a processing region of a semiconductor processing chamber. The operations may be performed in the same chamber in which aspects of method 500 may be performed, and one or more operations may also be performed in one or more chambers on a similar platform as a chamber in which operations of method 500 may be performed, or on other platforms.

The processing may include low temperature processing in some embodiments, and the substrate support may be maintained at a temperature of less than or about 0° C., and may be maintained at a temperature of less than or about −25° C., less than or about −50° C., less than or about −75° C., less than or about −100° C., less than or about −125° C., less than or about −150° C., less than or about −175° C., or lower. In some embodiments a first backside gas may be flowed during processing as previously described with regard to method 400. Subsequent processing, the substrate may be raised from a surface of the substrate support at operation 510. The substrate may be raised to any extent, such as on lift pins from the substrate support. For example, the substrate may be lifted so that the substrate is not in direct contact with the puck. In some embodiments the substrate may be partially lifted from the substrate support, such as to a height below a height at which the substrate may be delivered to the processing chamber or removed from the processing chamber. By raising the substrate slightly from the substrate support, the substrate may be conductively decoupled from the substrate support, while still at least partially operating to limit deposition or condensation on the substrate support.

At operation 515 a plasma may be formed within the processing region of the processing chamber. For example, an inert gas or precursor, such as any of the non-reactive species discussed previously, may be flowed into the processing region of the chamber, and a plasma may be formed, although additional precursors may be utilized including hydrogen, oxygen, or other materials, which may not be fully non-reactive. During formation of the plasma, or during the operation including formation of the plasma, a backside gas may be flowed through the substrate support at operation 520, which may flow between the substrate being lifted and the support surface of the substrate support. The backside gas may be any of the non-reactive backside gases discussed previously, and may be the same or a different gas as the gas being used to form the plasma.

The backside gas may be flowed at any of the flow rates previously described, and may be flowed to at least partially or fully limit ingress of particles between the semiconductor substrate and the substrate support. The backside gas may also improve a thermal barrier between the substrate support and the substrate, while the substrate may be heated. The method may include raising the temperature of the substrate at optional operation 525. By separating the substrate from the substrate support, the temperature may be raised more quickly, which may reduce queue times. Additionally, by flowing the backside gas between the substrate and the substrate support, an improved thermal barrier may be formed, which may further facilitate heating. The backside gas may reduce or limit materials from flowing between the substrate and the substrate support, which may limit deposition or condensation on the structure. Any number of additional methods may similarly be improved by utilizing backside gas flows, including sublimation operations, or any other process that may include raising the substrate from the support structure during processing.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of semiconductor processing, the method comprising:
    performing a process on a semiconductor substrate, the semiconductor substrate seated on a substrate support positioned within a processing region of a semiconductor processing chamber;
    subsequent to performing the process on the semiconductor substrate, wherein the process is performed while maintaining the substrate support at a temperature below or about −50° C.:
        i) separating the semiconductor substrate from the substrate support and supporting the semiconductor substrate on lift pins extending through the substrate support;
        ii) subsequent to separating the semiconductor substrate from the substrate support, flowing a first backside gas up a stem of the substrate support and through the substrate support into the processing region;
        iii) subsequent to separating the semiconductor substrate from the substrate support, raising a temperature of the semiconductor substrate;
        iv) subsequent to raising the temperature of the semiconductor substrate, removing the semiconductor substrate from the processing region of the semiconductor processing chamber;
        v) performing a plasma cleaning operation within the processing region of the semiconductor processing chamber, wherein the plasma cleaning operation generates plasma byproducts; and
        vi) flowing a second backside gas up the stem of the substrate support and through the substrate support into the processing region, wherein at least a portion of the second backside gas flows into the processing region through accesses in the substrate support, and wherein the second backside gas is a non-reactive species.

2. The method of semiconductor processing of claim 1, wherein the plasma cleaning operation comprises an oxygen-containing precursor or a halogen-containing precursor.

3. The method of semiconductor processing of claim 1, wherein the first backside gas is a non-reactive species.

4. The method of semiconductor processing of claim 1, wherein the first backside gas comprises helium, and wherein the second backside gas is nitrogen or a noble gas.

5. The method of semiconductor processing of claim 1, wherein the first backside gas comprises helium and at least one of argon or nitrogen.

6. The method of semiconductor processing of claim 1, wherein the first backside gas is characterized by a first flow rate less than or about 10 sccm.

7. The method of semiconductor processing of claim 1, wherein a flow rate of the second backside gas provides contact of plasma byproducts during the plasma cleaning operation with the substrate support about the accesses of the substrate support.

8. The method of semiconductor processing of claim 2, wherein a flow rate of the second backside gas limits ingress of plasma byproducts into the accesses in the substrate support.

9. A method of semiconductor processing, the method comprising:
    flowing a first backside gas at a first flow rate up a stem of a substrate support and through the substrate support in a processing region of a semiconductor processing chamber while performing a process on a semiconductor substrate seated on the substrate support, wherein the process is performed while maintaining the substrate support at a temperature below or about −100° C.;
    removing the semiconductor substrate from the semiconductor processing chamber;
    performing a plasma cleaning operation within the processing region of the semiconductor processing chamber; and
    flowing a second backside gas up the stem of a substrate support and through the substrate support at a second flow rate greater than the first flow rate while performing the plasma cleaning operation, wherein at least a portion of the second backside gas flows into the processing region through accesses in the substrate support.

10. The method of semiconductor processing of claim 9, wherein the plasma cleaning operation comprises an oxygen-containing precursor or a halogen-containing precursor.

11. The method of semiconductor processing of claim 9, wherein the first backside gas and the second backside gas are non-reactive species.

12. The method of semiconductor processing of claim 11, wherein the first backside gas comprises helium, and wherein the second backside gas comprises non-reactive species including at least one of nitrogen or a noble gas.

13. The method of semiconductor processing of claim 12, wherein the first backside gas comprises helium and at least one of argon or nitrogen.

14. The method of semiconductor processing of claim 12, wherein the first flow rate is less than or about 10 sccm.

15. A method of semiconductor processing, the method comprising:
    performing a process on a semiconductor substrate, the semiconductor substrate seated on a substrate support within a processing region of a semiconductor processing chamber, wherein the process is performed while maintaining the substrate support at a temperature below or about −50° C.;

raising the semiconductor substrate from the substrate support;

forming a plasma of a post-treatment precursor within the processing region of the semiconductor processing chamber;

flowing a non-reactive backside gas through the substrate support and between the semiconductor substrate and the substrate support; and increasing a temperature of the semiconductor substrate.

16. The method of semiconductor processing of claim 15, wherein raising the semiconductor substrate comprises separating the semiconductor substrate from the substrate support and supporting the semiconductor substrate on lift pins extending through the substrate support.

17. The method of semiconductor processing of claim 15, wherein the process is performed while maintaining the substrate support at a temperature below or about −100° C.

18. The method of semiconductor processing of claim 15, wherein the non-reactive backside gas comprises nitrogen or a noble gas.

19. The method of semiconductor processing of claim 15, wherein the non-reactive backside gas is flowed at a flow rate to limit ingress of particles between the semiconductor substrate and the substrate support.

* * * * *